US012604467B2

(12) United States Patent
Chen

(10) Patent No.: US 12,604,467 B2
(45) Date of Patent: Apr. 14, 2026

(54) SEMICONDUCTOR WITH EXTENDED LIFE TIME FLASH MEMORY

(71) Applicant: HON HAI PRECISION INDUSTRY CO., LTD., New Taipei (TW)

(72) Inventor: Chung-Yi Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 18/649,949

(22) Filed: Apr. 29, 2024

(65) Prior Publication Data

US 2024/0284667 A1 Aug. 22, 2024

Related U.S. Application Data

(62) Division of application No. 17/538,000, filed on Nov. 30, 2021, now Pat. No. 12,004,345.

(30) Foreign Application Priority Data

Feb. 1, 2021 (CN) .......................... 202110139342.1

(51) Int. Cl.
| | |
|---|---|
| *H10B 41/27* | (2023.01) |
| *H01L 25/07* | (2006.01) |
| *H10D 30/01* | (2025.01) |
| *H10D 30/68* | (2025.01) |

(52) U.S. Cl.
CPC ........... *H10B 41/27* (2023.02); *H01L 25/074* (2013.01); *H10D 30/0411* (2025.01); *H10D 30/68* (2025.01); *H10D 30/6891* (2025.01)

(58) Field of Classification Search
None
See application file for complete search history.

(56) References Cited

U.S. PATENT DOCUMENTS

| | | | |
|---|---|---|---|
| 8,633,104 B2 | 1/2014 | Pyo et al. | |
| 2013/0017629 A1 | 1/2013 | Pyo et al. | |
| 2020/0161319 A1 | 5/2020 | Wu et al. | |
| 2020/0185402 A1 | 6/2020 | Son et al. | |
| 2021/0408253 A1* | 12/2021 | Chang ................... H10B 41/30 |

* cited by examiner

*Primary Examiner* — Xiaoming Liu
(74) *Attorney, Agent, or Firm* — ScienBiziP, P.C.

(57) ABSTRACT

A semiconductor with 3D flash memory storing cells giving an extended life time includes a stack structure in each storing cell, a receiving space crossing through the stack structure, a blocking layer, at least one floating gate layer, and a channel layer. The stack structure includes at least one control gate layer, at least two dielectric layers, and at least one erasing layer. The receiving space comprises a first receiving portion communicating with several second receiving portions. The first receiving portion crosses through the stack structure and the second receiving portions are coplanar with the control gate layer. The blocking layer insulates the floating gate layer from the control gate layers. The erasing layer and floating gate layer form a passageway for electrons when data erasure is required in the semiconductor. A method for fabricating the semiconductor is also disclosed.

5 Claims, 10 Drawing Sheets 13  14  15

10

16
17
18
12

SEMICONDUCTOR WITH EXTENDED LIFE TIME FLASH MEMORY

FIELD

The subject matter herein generally relates to semiconductor memory.

BACKGROUND

In some current semiconductors, three-dimensional (3D) flash can store data for a long period without being powered, and has advantages of high-density, fast storing speed, and ease of erasing and rewriting. While storing or erasing data in the 3D flash, based on the voltage between a floating gate and a control gate, electrons move between the floating gate and a channel layer by passing through a tunnel dielectric layer. During repeated storing and erasing data in the 3D flash, the performance of the tunnel dielectric layer is reduced, reducing the effective function of the 3D flash.

Thus, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
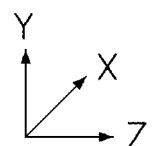
FIG. 1 is a diagram illustrating an embodiment of a semiconductor along a horizontal direction.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure provides a semiconductor and a method for fabricating the semiconductor for reducing a dissipation of the tunnel dielectric layer while storing or erasing data.

Figure 2:
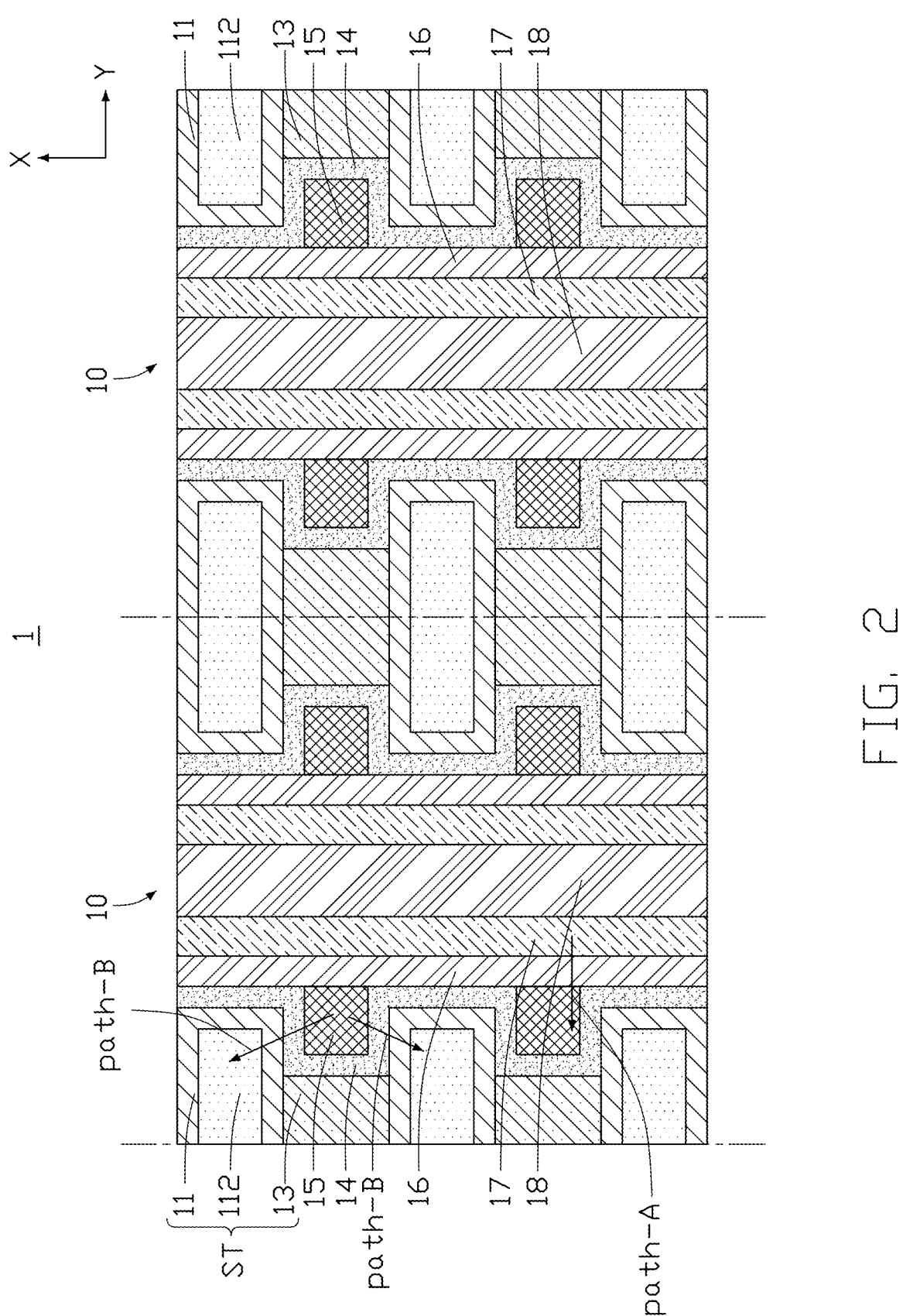
FIG. 2 is a diagram illustrating an embodiment of the semiconductor along a vertical direction.

FIG. 1 shows a semiconductor 1 taken along a horizontal direction. FIG. 2 shows the semiconductor 1 taken along a vertical direction. The semiconductor 1 in a stack structure includes a plurality of storing cells 10. FIG. 1 only shows one storing cell 10, and FIG. 2 show two adjacent storing cells 10. In one embodiment, the semiconductor 1 can be a three-dimensional (3D) flash. Each storing cell 10 can be implemented to store data or allow erasure of data.

Figure 6:
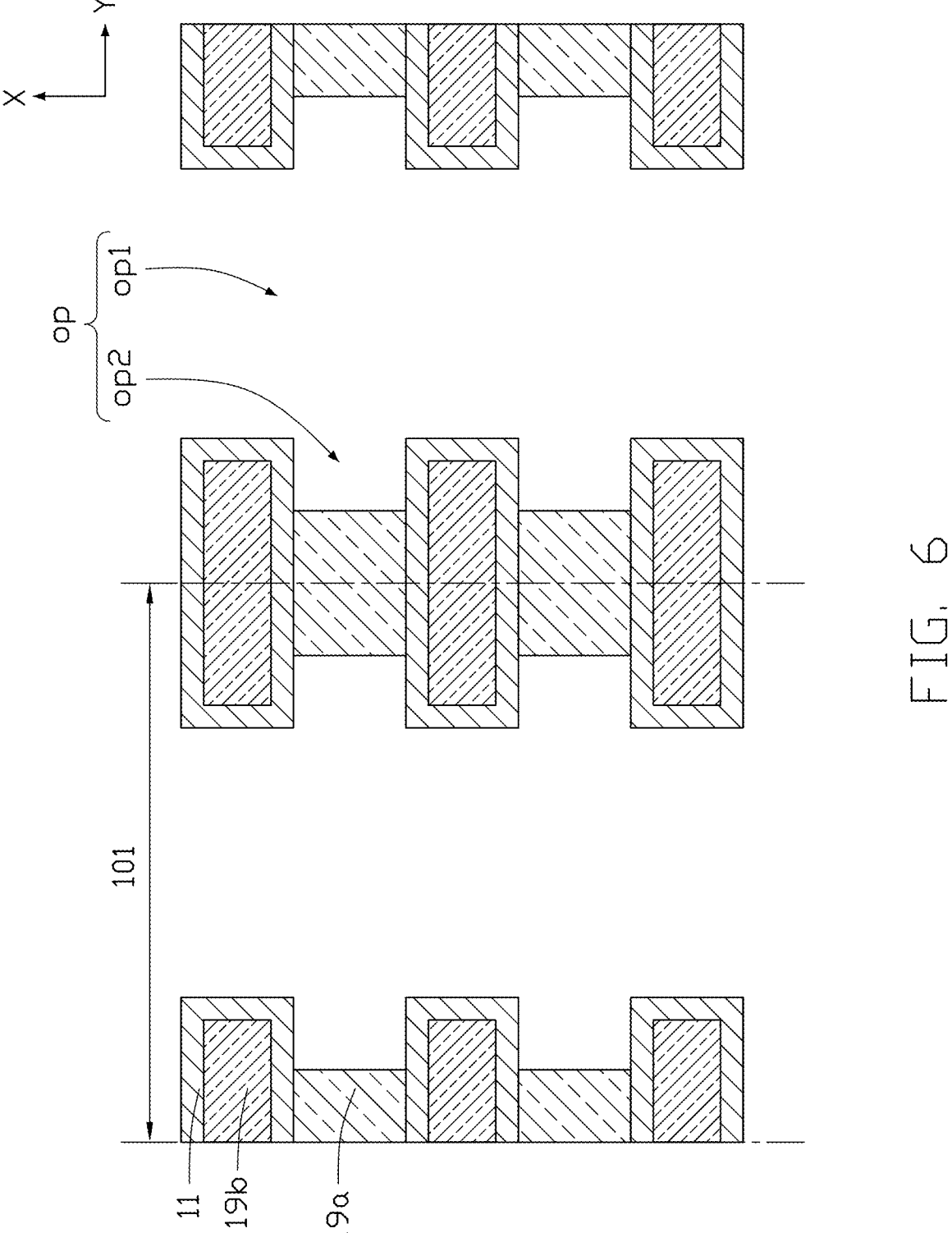
FIG. 6 is a diagram illustrating an embodiment of the vertical structures in block S11 of FIG. 4.

Each storing cell 10 includes a stack structure ST, a receiving space OP (as shown in FIG. 6), an insulating layer 12, a floating gate layer 15, a blocking layer 14, a tunnel dielectric layer 16, a channel layer 17, and a filling layer 18.

The stack structure ST includes several control gate layers 13, several dielectric layers 11, and several erasing layers 112. In one embodiment, the stack structure ST includes two control gate layers 13, three dielectric layers 11, and three erasing layers 112. The topmost and bottommost dielectric layers 11 are respectively the top layer and the bottom layer. The reset dielectric layer 11 is the middle layer. Each control gate layer 13 is sandwiched between two adjacent dielectric layers 11. Each erasing layer 112 is separated from the control gate layer 13 by the dielectric layer 11. The erasing layer 112 is separated from the floating gate layer 15 by the dielectric layer 11 and the blocking layer 14.

The blocking layer 14, the tunnel dielectric layer 16, the channel layer 17, and the filling layer 18 inside the control gate layer 13 are substantially annular in shape (as shown in FIG. 1). In one embodiment, the control gate layer 13 is made of conductive material.

Along a first vertical direction X, the erasing layer 112 is insulated from the corresponding control gate layer 13 by the dielectric layer 11. The erasing layer 112 is insulated from the floating gate layer 15 by the dielectric layer 11 and the blocking layer 14. The erasing layer 112 is insulated from the channel layer 17 in the receiving space OP by the dielectric layer 11 and the blocking layer 14. The filling layer 18 can be made of dielectric material, and is insulated from the adjacent channel layer 17.

Figure 3:
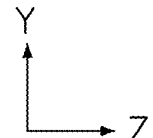
FIG. 3 is a diagram illustrating an embodiment of the erasing layer along the horizontal direction.
Figure 3:
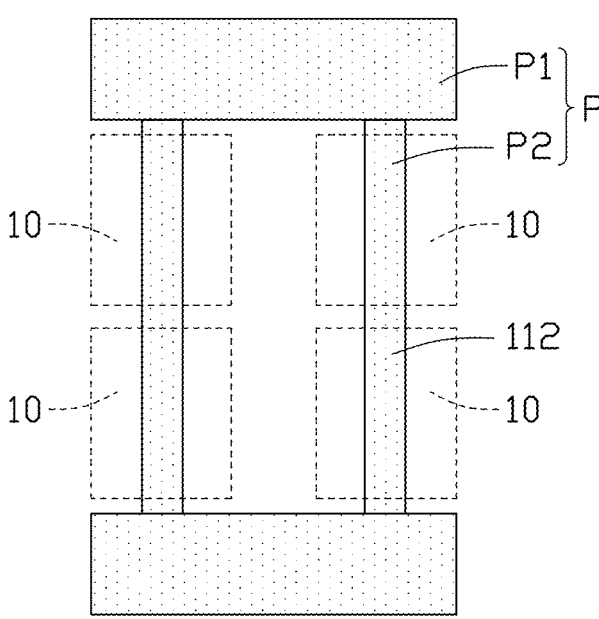

FIG. 3 shows the erasing layer 112 of the storing cells 10 in a 2*2 matrix. Along second horizontal direction Y, the erasing layer 112 is coplanar with and in contact with the erasing layer 112 in another adjacent storing cell 10 in a whole shape technology. The second horizontal direction Y is perpendicular to the first vertical direction X. In other words, the erasing layers 112 in different storing cells 10 are in contact with each other to form a specified pattern P. Viewing along the first vertical direction X, the specified pattern P include two first portions P1 parallel with each other along the second horizontal direction Y, and at least two second portions P2 parallel with each along a third direction Z. The first vertical direction X, the second horizontal direction Y, and the third direction Z are all perpendicular to each other to form a three-dimensional coordinate system. At least one end of the second portion P2 is in contact with the first portion P1. In one embodiment, both ends of the second portion P2 are in contact with the first portion P1. The first portion P1 establishes an electrical connection between the erasing layer 112 and an external circuit. In one embodiment, the erasing layer 112 is made of conductive material with low resistance, such as metal, silicide, the dielectric layer 11 is made of insulating material.

Referring to FIG. 6, the receiving space OP crosses the middle portion of the stack structure ST. In one embodiment, the receiving space OP includes a first receiving portion OP1 and several second receiving portions OP2. The first receiving portion OP1 crosses through the stack structure ST along the first vertical direction X. The second receiving portion OP2 communicates with the first receiving portion OP1. The second receiving portions OP2 extend from the first receiving portion OP1 to the control gate layer 13 along the second horizontal direction Y. In one embodiment, there are four second receiving portions OP2. The second receiving portions OP2 are symmetrically disposed on opposite sides of the first receiving portion OP1.

A part of the blocking layer 14 is received in the second receiving portion OP2, and the rest of the blocking layer 14 is receiving in the first receiving OP1. The blocking layer 14 is coplanar with the control gate layer 13. Along the first vertical direction X, a double thickness of the blocking layer 14 is less than a thickness of the control gate layer 13, the blocking layer 14 is completely received in the second receiving portion OP2, and a space (not labeled) for receiving the floating gate layer 15. The blocking layer 14 in the first receiving portion OP1 is parallel with the first vertical direction X.

The floating gate layer 15 is received in the space of the blocking layer 14, and in the second receiving portion OP2. Along the second horizontal direction Y, the floating gate layer 15 is coplanar with the control gate layer 13. The floating gate layer 15 is substantially in the shape of half a circle (or half of an oval, as shown in FIG. 1). Along the first vertical direction X, the floating gate layer 15 is partly overlapped with the erasing layer 112. In one embodiment, the floating gate layer 15 is made of conductive material such as silicide. The floating gate layer 15 is used for storing data.

The tunnel dielectric layer 16 is received in the first receiving portion OP1, and sidewall of the tunnel dielectric layer 16 is covered by the blocking layer 14 and the floating gate layer 15 along the first vertical direction X. The tunnel dielectric layer 16 is substantially in an annular shape (as shown in FIG. 1).

The channel layer 17 is disposed in the first receiving portion OP1, and is sandwiched between the tunnel dielectric layer 16 and the filling layer 18. The channel layer 17 is substantially in an annular shape (as shown in FIG. 1). In one embodiment, the channel layer 17 is made of silicon or other semiconductor material.

The filling layer 18 fills the empty part of the first receiving portion OP1. In one embodiment, the filling layer 18 is made of insulation material.

Referring to FIG. 1, the storing cell 10 further includes the insulating layer 12. The insulating layer 12 insulates the blocking layer 14 disposed on opposite side of the receiving space OP along the second horizontal direction Y, and insulates the tunnel dielectric layers in adjacent storing cells 10 along the third direction Z. In one embodiment, the insulating layer 12 is made of silicon oxide material.

A storing operation of the storing cell 10 is the same as in a normal semiconductor device. For example, when the voltage is applied on the control gate layer 13, electrons moves along a data writing path (path-A) from the channel layer 17 into the floating gate layer 15 through the tunnel dielectric layer 16, thus data is received in the storing cell 10.

When the storing cell 10 executes a data erasing operation, a positive voltage is applied on the erasing layer 112, the floating gate layer 15 floats, a voltage less than the positive voltage is applied on the control gate layer 13, thus a punch-through between the erasing layer 112 and the control gate layer 13 is avoided. Further, a ground voltage (or negative voltage) is applied on the channel layer 17, and the electrons move along a data erasing path (path-B) from the floating gate layer 15 to the erasing layer 112 through the portion of the dielectric layer 11, which is overlapped with the erasing layer 112 and the floating gate layer 15, and the sidewall of the blocking layer 14. Such electrons do not pass through the tunnel dielectric layer 16. In one embodiment, the positive voltage is in a range from 10-15 volts (V).

The erasing layer 112 being overlapped with the floating gate layer 15 along the first vertical direction X in the structure of the semiconductor causes the electrons to move along the path-B, a path different from the data writing path path-A. Thus, even repeated data writing and data erasing processes cause less dissipation of the tunnel dielectric layer 16 in the storing cell 10, and a life time of the semiconductor 1 is extended.

Figure 4:
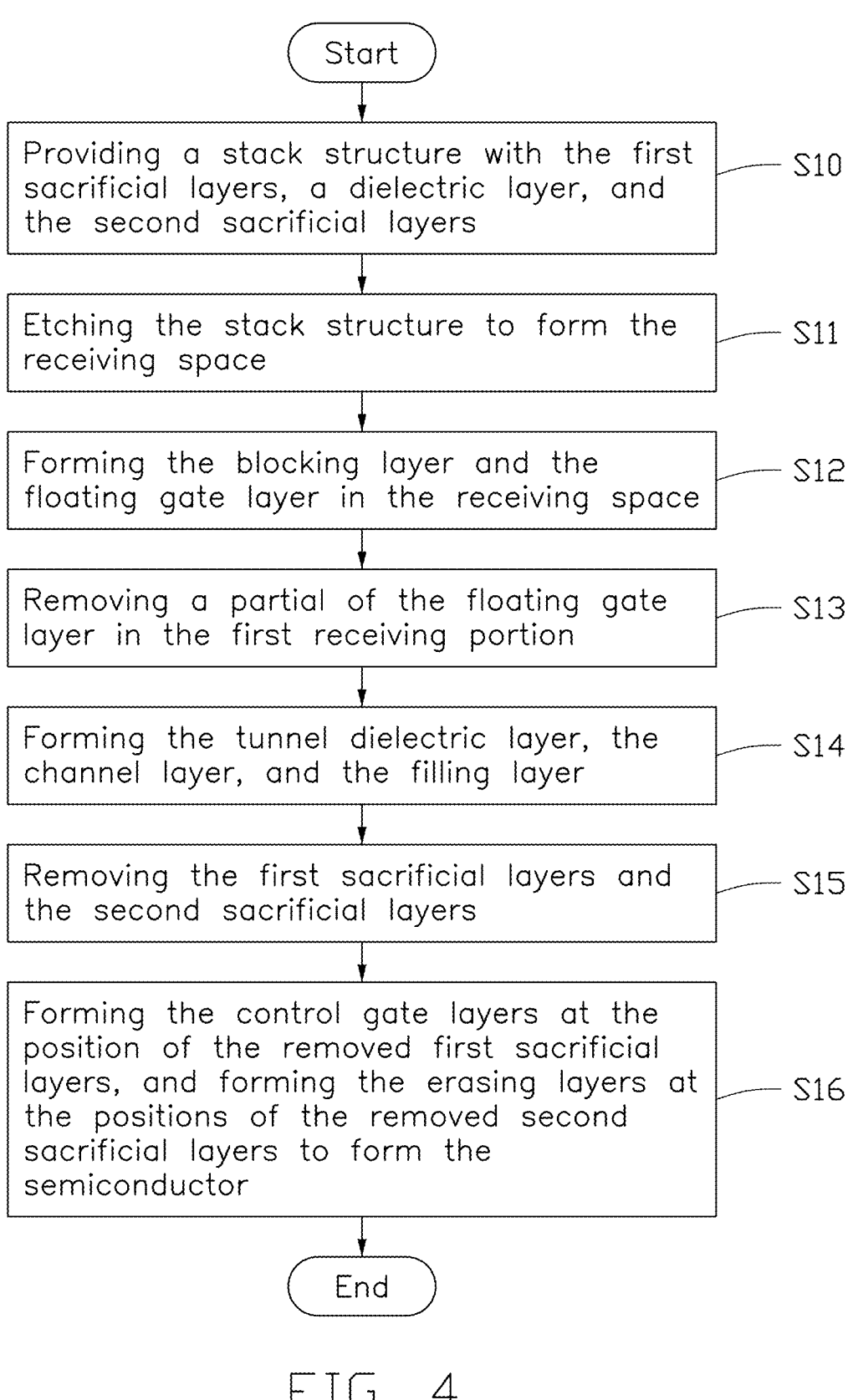
FIG. 4 is a flowchart illustrating an embodiment of a method for fabricating the semiconductor.

FIG. 4 shows a flowchart of a method for manufacturing the above semiconductor. In at least one embodiment, a method for fabricating the semiconductor 1 may comprise at least the following steps, which may be followed in a different order:

In block S10, a stack structure ST with at least one first sacrificial layer 19*a*, at least one dielectric layer 11, and at least one second sacrificial layer 19*b* is provided.

Figure 5:
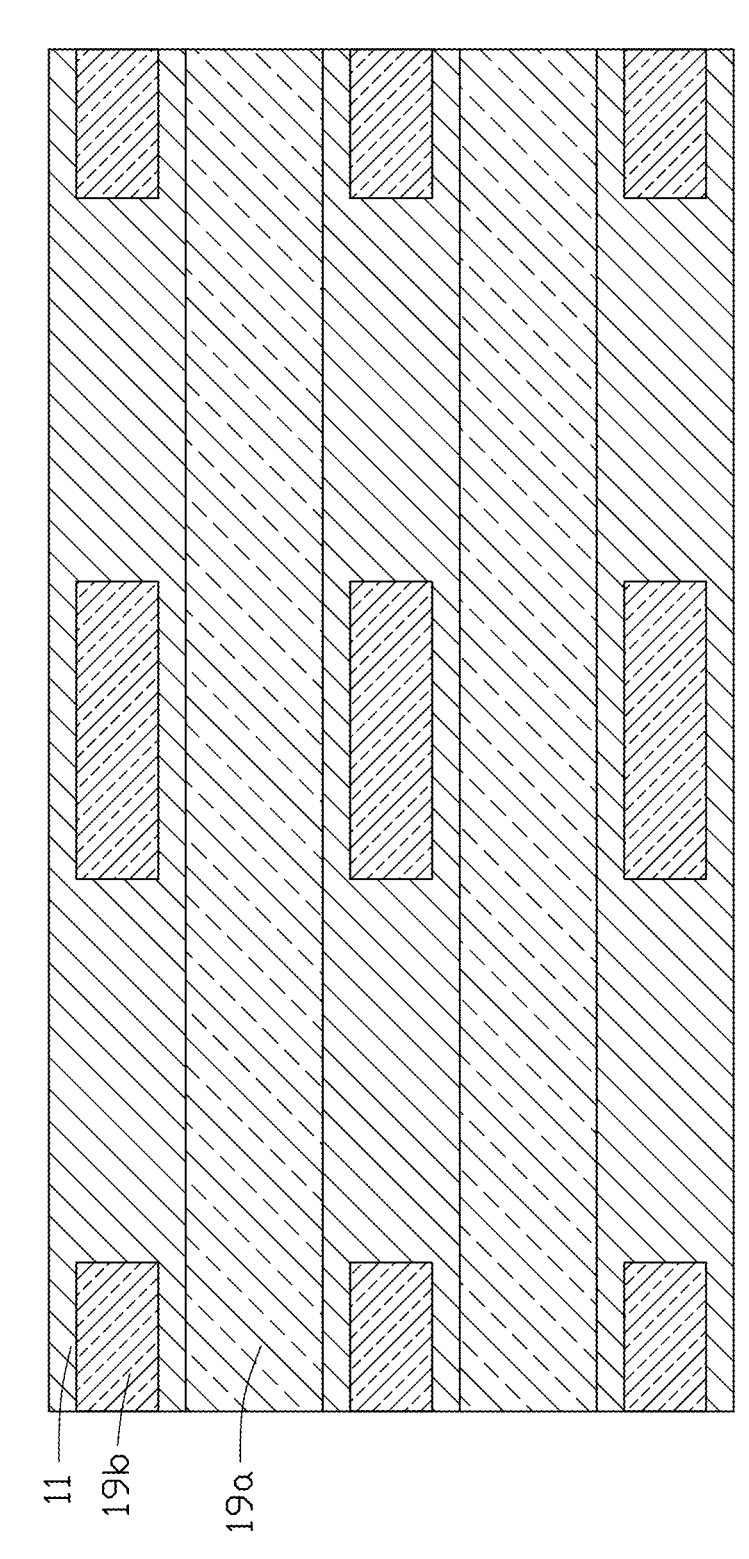
FIG. 5 is a diagram illustrating an embodiment of the vertical structures in block S10 of FIG. 4.

Referring to FIG. 5, in one embodiment, the stack structure ST includes two first sacrificial layers 19*a*, three dielectric layers 11, and three second sacrificial layers 19*b*. The two first sacrificial layers 19*a* are separated from each other by the dielectric layer 11. The dielectric layer 11 is formed in depositing and flattening manner. During the depositing process, the dielectric layer 11 is etched and patterned to form the second sacrificial layers 19*b* in a first material, and after the second sacrificial layers 19*b* are formed, the depositing process is continued to form the dielectric layer 11 for separating the first sacrificial layer 19*a* and the second sacrificial layer 19*b*, and then the first sacrificial layer 19*a* is formed on the deposited dielectric layer 11. The above processes are repeatedly to form the stack structure ST. The topmost and bottommost dielectric layers 11 are the top layer and the bottom layer, and the rest of the dielectric layers 11 is the middle layer. The control gate layer 13 is sandwiched between two adjacent dielectric layer 11. The second sacrificial layer 19*b* is insulated from the first sacrificial layer 19*a* by the dielectric layer 11. Each second sacrificial layer 19b is in a specified pattern P. As shown in FIG. 3, the second sacrificial layers 19b are arranged in a 2*2 matrix. In one embodiment, the specified pattern P include two parallel first portions P1 along second horizontal direction Y and at least two parallel second portions P2 along a third direction Z. In other embodiments, the first portion P1 can be divided into more second sacrificial layers 19b in the storing cells 10. At least one end of the second portion P2 is in contact with the first portion P1. In one embodiment, both ends of the second portion P2 is in contact with the first portion P1. In one embodiment, the first material can be silicon nitride, and the dielectric layer 11 is made of insulation material.

In block S11, the stack structure ST is etched to form a receiving space (op).

Referring to FIG. 6, the stack structure ST is divided into several storing regions 101 in a same size. Each storing region 101 correspond to a storing cell 10. The receiving space OP crosses the middle portion of the stack structure ST in one storing region 101. In one embodiment, the receiving space OP includes a first receiving portion OP1 and several receiving portions OP2. The first receiving portion OP1 crosses through the stack structure ST along the first vertical direction X. The second receiving portion OP2 communicates with the first receiving portion OP1. The second receiving portions OP2 are extended from the first receiving portion OP1 to the control gate layer 13 along the second horizontal direction Y. In one embodiment, there are four second receiving portions OP2. The second receiving portions OP2 are symmetrically disposed on opposite sides of the first receiving portion OP1. Along the first vertical direction X, the second receiving portion OP2 is overlapped with the second sacrificial layer 19b, and the first sacrificial layer 19a is overlapped with the second sacrificial layer 19b.

In block S12, a blocking layer 14 and a floating gate layer 15 is formed in the receiving space 15.

Figure 7:
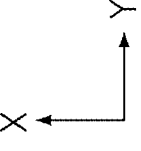
FIG. 7 is a diagram illustrating an embodiment of the vertical structures in block S12 of FIG. 4.
Figure 7:
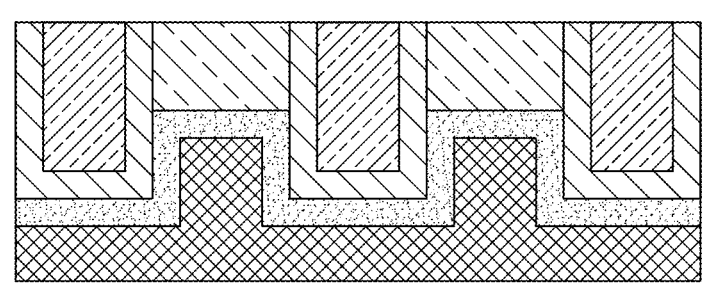
Figure 7:
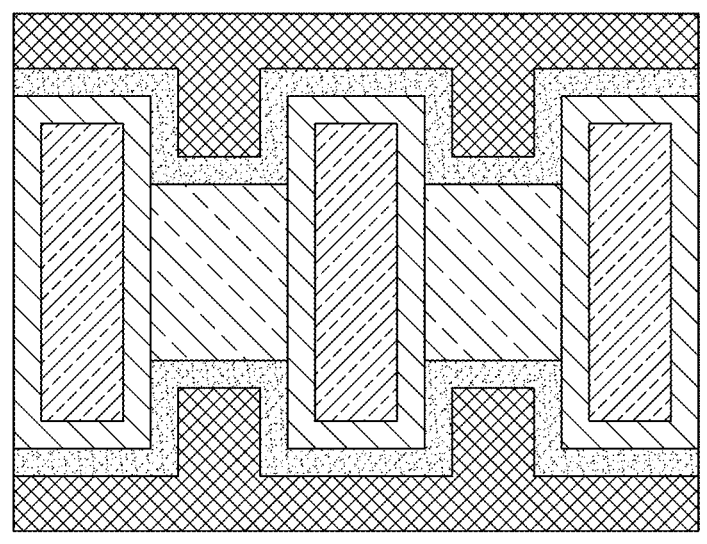
Figure 7:
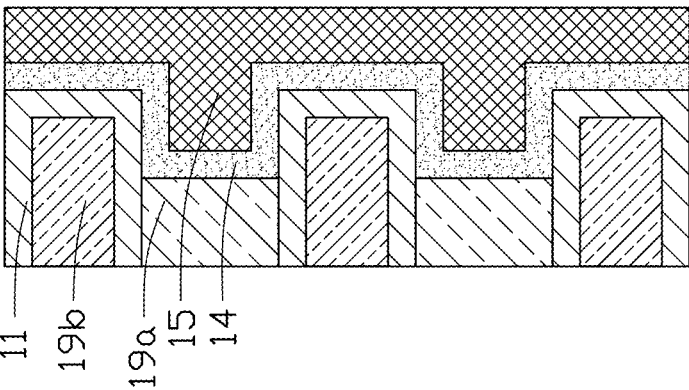

Referring to FIG. 7, a partial of the blocking layer 14 is received in the second receiving portion OP2, and is coplanar with the first sacrificial layer 19a for covering a sidewall of the first sacrificial layer 19a. A partial of the blocking layer 14 is parallel with the first vertical direction X. Along the first vertical direction X, the blocking layer 14 is overlapped with the second sacrificial layer 19b. The floating gate layer 15 is received in the inside of the blocking layer 14 being received in the second receiving portion 19b. Along the second horizontal direction Y, the floating gate layer 15 is coplanar with the control gate layer 13. A partial of the floating gate layer 15 is parallel with the first vertical direction X. In one embodiment, the floating gate 15 is made of conductivity material, such as silicide.

Figure 8:
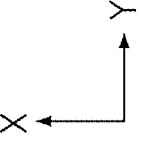
FIG. 8 is a diagram illustrating an embodiment of the vertical structures in block S13 of FIG. 4.
Figure 8:
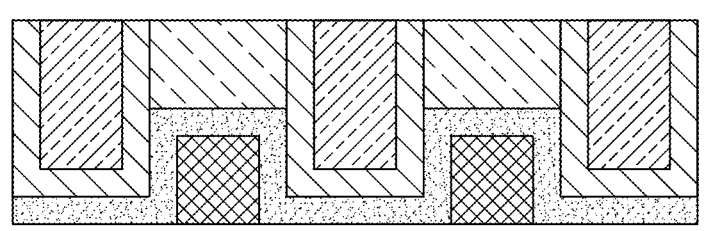
Figure 8:
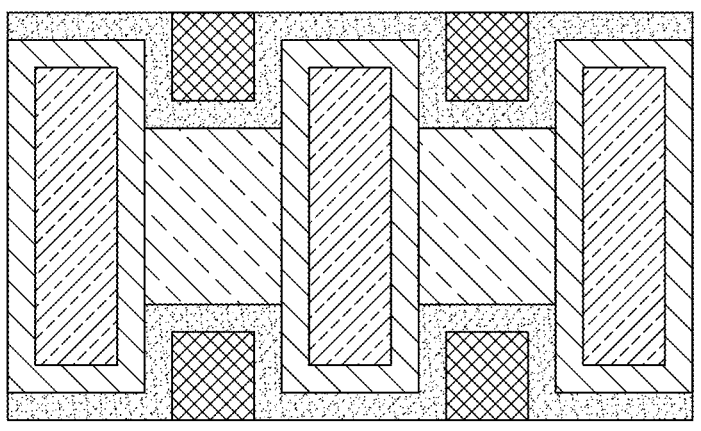
Figure 8:
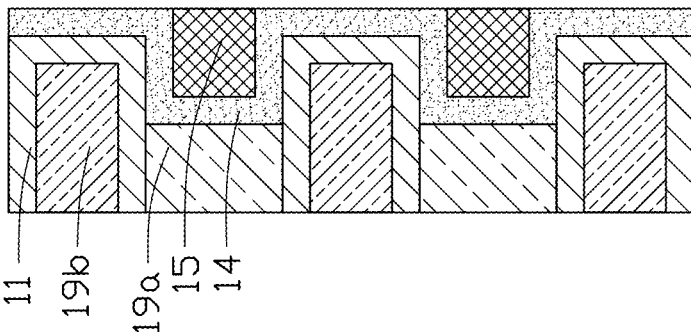

In block S13, a partial of the floating gate layer 15 received in the first receiving portion OP1 is removed, for ensuring the rest of the floating gate layer 15 being completely received in the second receiving portion OP2 as shown in FIG. 8.

In block S14, a tunnel dielectric layer 16, a channel layer 17, and a filling layer 18 are formed in that order in the first receiving portion OP1.

Figure 9:
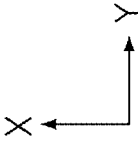
FIG. 9 is a diagram illustrating an embodiment of the vertical structures in block S14 of FIG. 4.
Figure 9:
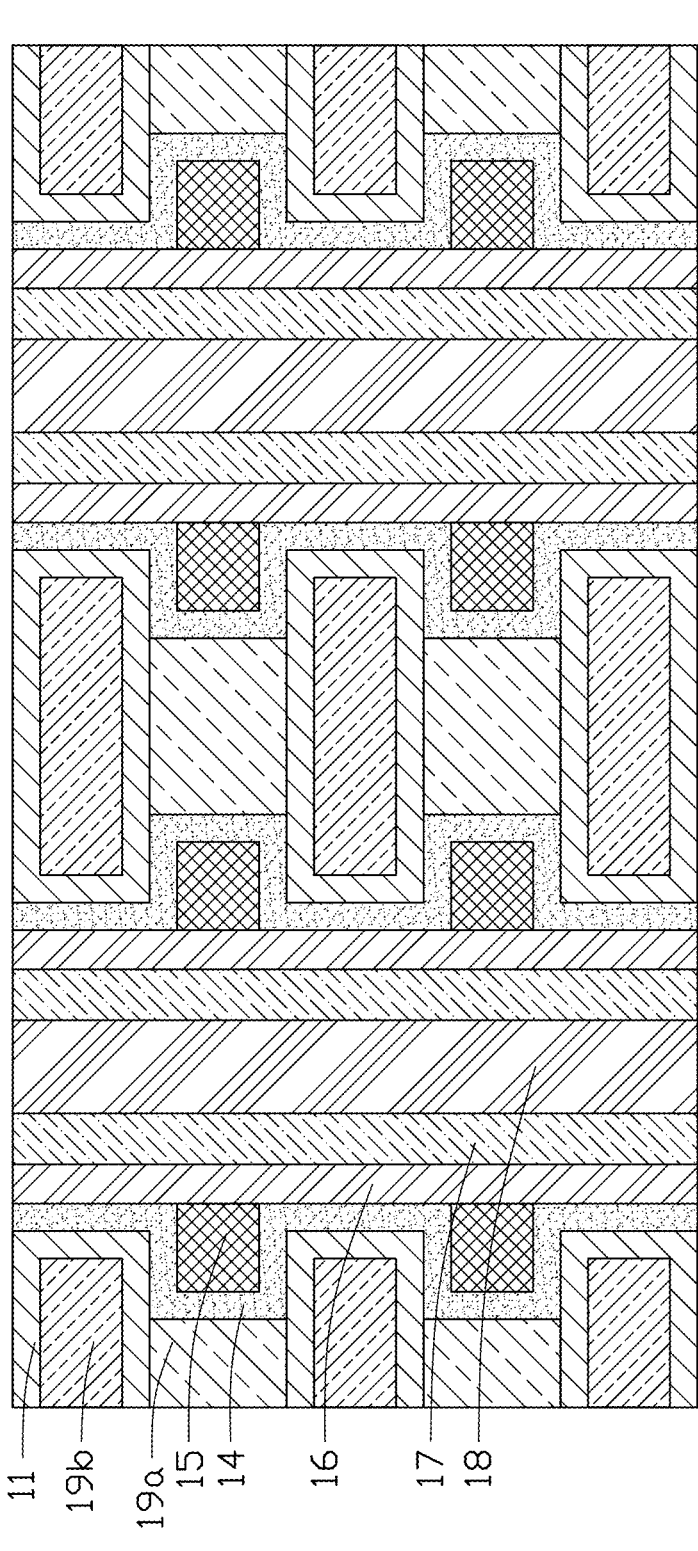

Referring to FIGS. 2 and 9, in one embodiment, the tunnel dielectric layer 16 is received in the first receiving portion OP1, and covers sidewalls of the blocking layer 14 and the floating gate layer 15 along the first vertical direction X. The channel layer 17 is received in the first receiving portion OP1. The channel layer 17 is disposed on an inner side of the tunnel dielectric layer 16. In one embodiment, the channel layer 17 is made of semiconductor material, such as SI. The filling layer 18 fills the rest space of the receiving portion OP1. In one embodiment, the filling layer 18 is made of insulation material.

Figure 10:
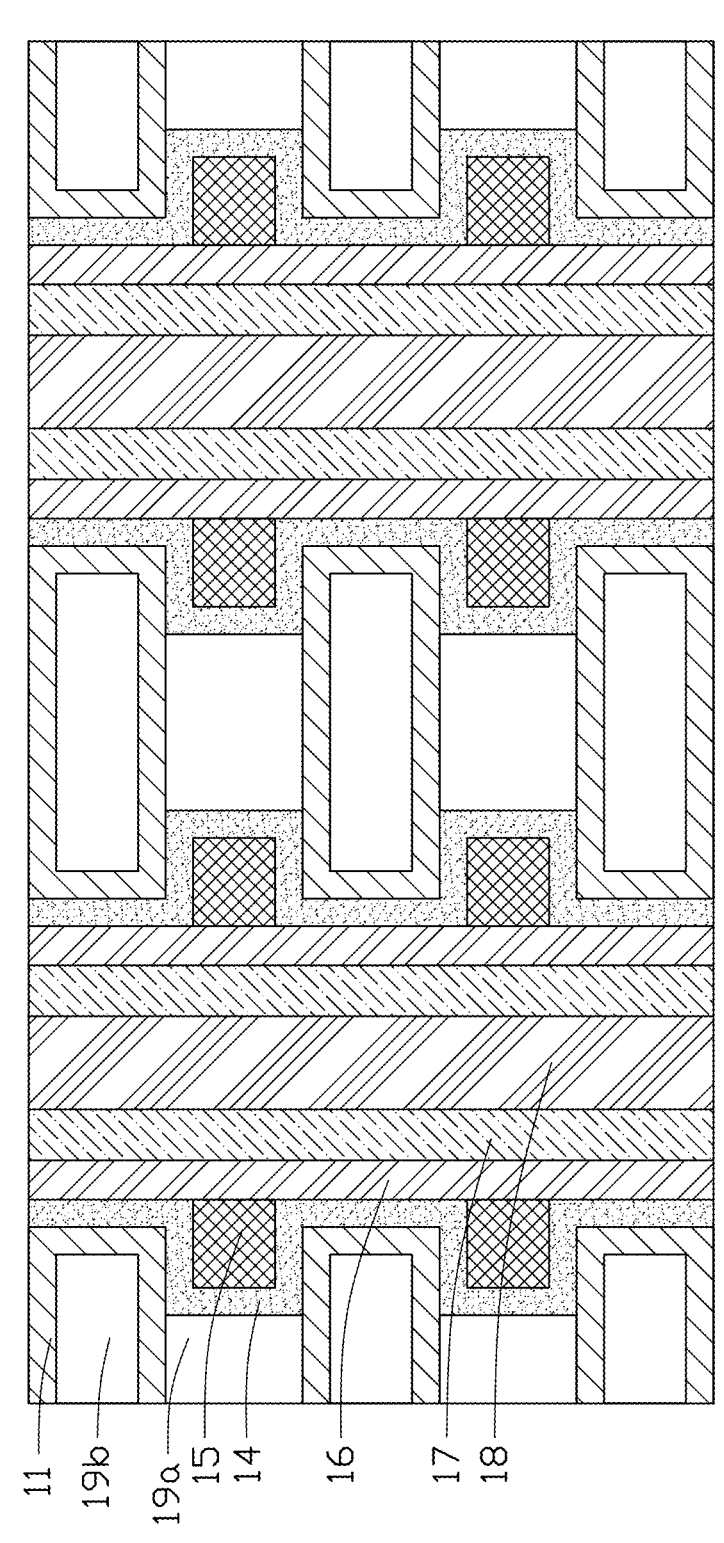
FIG. 10 is a diagram illustrating an embodiment of the vertical structures in block S15 of FIG. 4.

In block S15, the first sacrificial layers 19a and the second sacrificial layers 19b are removed as shown in FIG. 10, In block S16, the control gate layers 13 are formed at the positions of the removed first sacrificial layer 19a, and the erasing layers 112 are formed at the positions of the removed second sacrificial layers 19b, to form the semiconductor 1.

Referring to FIG. 2, in one embodiment, the control gate layer 13 and the erasing layer 112 are formed by filling the positions of the removed made of a second material. The second material is made of conductive material with low resistance, such as metal or silicide.

While executing a data writing process, the control gate layer 13 is being applied with a voltage, and electron moves from the channel layer 17 into the floating gate layer 15 by passing through the tunnel dielectric layer 16, for storing data.

While executing a data erasing process, a positive voltage is applied on the erasing layer 112, the floating gate layer 15 floats, a voltage less than the positive voltage is applied on the control gate layer 13, thus a punch-through between the erasing layer 112 and the control gate layer 13 is avoided. Further, a ground voltage or a negative voltage is applied on the channel layer 17, and the electron moves along a data erasing path path-B from the floating gate layer 15 to the erasing layer 112 through the portion of the dielectric layer 11, which is overlapped with the erasing layer 112 and the floating gate layer 15, and the sidewall of the blocking layer 14, Such electrons do not pass through the tunnel dielectric layer 16. In one embodiment, the positive voltage is in a range from 10-15 volts (V).

The erasing layer 112 being overlapped with the floating gate layer 15 along the first vertical direction X causes the electrons to move along the path-B, a path different from the data writing path path-A. Thus, even repeated data writing and data erasing processes cause less dissipation of the tunnel dielectric layer 16 in the storing cell 10, and a life time of the semiconductor 1 is extended.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A semiconductor comprising:

several storing cells; each of the several storing cells comprising:

a stack structure with at least one control gate layer, at least two dielectric layers, at least one erasing layer, the erasing layer is insulated from the control gate layer by the dielectric layer;

a receiving space crossed through the stack structure, wherein the receiving space comprises a first receiving portion, and several second receiving portions communicated with the first receiving portion; the first receiving portion is crossed through the stack structure; the second receiving portions are coplanar with the control gate layer;

a blocking layer received in the second receiving portion;

several floating gate layers received in the second receiving portion, and insulated from the control gate layers by the blocking layer; and a channel layer received in the second receiving portion, wherein an electron passing path is formed by the erasing layer cooperating with the floating gate layer in response that the semiconductor executes a data erasing process; and wherein the erasing layer comprises a specified pattern, from a top view, comprising two rectangular first portions parallel to each other and extend along a second horizontal direction and at least two rectangular second portions parallel to each other and extend along a third direction, the third direction is perpendicular to the second horizontal direction, at least one end of the rectangular second portion is in contact with the rectangular first portion, and the rectangular first portion comprises an electrical connection between the erasing layer and an external circuit.

2. The semiconductor of claim 1, wherein in response that the semiconductor executes the data erasing process, a positive voltage is applied on the erasing layer, the floating gate layer floats, a voltage less than the positive voltage is applied on the control gate layer; the electron passing path is formed from the floating gate layer to the erasing layer by passing through the overlapped portion of the dielectric layer between the erasing portion and the control gate layer.

3. The semiconductor of claim 1, wherein along a direction parallel with the control gate layer, the erasing layer is insulated from the channel layer by the dielectric layer and the blocking layer in the receiving space.

4. The semiconductor of claim 1, wherein the erasing layer is in contact with the erasing layer in an adjacent storing cell of the several storing cells in a whole shape technology.

5. The semiconductor of claim 1, wherein along a direction perpendicular to the stack structure, the erasing layer is partly overlapped with the floating gate layer.

* * * * *